United States Patent
Liu et al.

(10) Patent No.: US 12,055,571 B2
(45) Date of Patent: Aug. 6, 2024

(54) FREQUENCY DETECTION DEVICE FOR CLOCK SIGNAL AND DETECTION METHOD THEREOF

(71) Applicant: Winbond Electronics Corp., Taichung (TW)

(72) Inventors: Hsing-Yu Liu, Taichung (TW); Jyun-Yu Lai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 256 days.

(21) Appl. No.: 17/878,059

(22) Filed: Aug. 1, 2022

(65) Prior Publication Data
US 2024/0036090 A1    Feb. 1, 2024

(51) Int. Cl.
| | |
|---|---|
| G01R 23/02 | (2006.01) |
| H03K 3/037 | (2006.01) |
| H03K 5/00 | (2006.01) |
| H03K 5/01 | (2006.01) |

(52) U.S. Cl.
CPC ............ *G01R 23/02* (2013.01); *H03K 3/037* (2013.01); *H03K 5/01* (2013.01); *H03K 2005/00019* (2013.01)

(58) Field of Classification Search
CPC .......... G01R 23/00; G01R 23/02; H03K 3/00; H03K 3/02; H03K 3/027; H03K 3/037; H03K 5/00; H03K 5/01; H03K 2005/00013; H03K 2005/00019
USPC ................. 324/600, 612, 620, 625
See application file for complete search history.

(56) References Cited

U.S. PATENT DOCUMENTS

| | | | | |
|---|---|---|---|---|
| 4,399,553 | A * | 8/1983 | Toyama | G06V 30/2253 382/207 |
| 5,731,843 | A * | 3/1998 | Cappels, Sr. | G09G 5/008 348/537 |
| 8,589,717 | B1 * | 11/2013 | Davis | G06F 1/04 713/600 |
| 8,947,167 | B2 | 2/2015 | Kargar et al. | |
| 9,444,440 | B2 * | 9/2016 | Jain | H03K 5/1534 |
| 9,843,437 | B2 * | 12/2017 | Povazanec | H03K 5/05 |
| 10,530,347 | B2 * | 1/2020 | Tang | G11C 7/1093 |
| 2012/0306551 | A1 * | 12/2012 | Moon | H03L 7/0816 327/149 |

FOREIGN PATENT DOCUMENTS

| | | |
|---|---|---|
| CN | 110073601 | 7/2019 |
| TW | I452837 | 9/2014 |
| WO | WO-9610816 A1 * | 4/1996 ............ G09G 5/008 |

* cited by examiner

*Primary Examiner* — Hoai-An D. Nguyen
(74) *Attorney, Agent, or Firm* — JCIPRNET

(57) ABSTRACT

A frequency detection device for a clock signal and a detection method thereof are provided. The frequency detection device includes a pulse signal generator, a sampling signal generator, a delay device, and a sampling circuit. The pulse signal generator detects a plurality of transition edges of the clock signal and generates a pulse signal according to the transition edges of the clock signal. The sampling signal generator generates a sampling signal based on a command signal according to pluses of the pulse signal. The delay device delays the command signal to generate a delayed command signal. The sampling circuit samples the delayed command signal according to the sampling signal to generate a detection result.

17 Claims, 6 Drawing Sheets

FREQUENCY DETECTION DEVICE FOR CLOCK SIGNAL AND DETECTION METHOD THEREOF

BACKGROUND

Technical Field

The present disclosure relates to a frequency detection device for a clock signal and a detection method thereof, and in particular to an invention of a frequency detection device for a clock signal and a detection method thereof that does not need a reference clock signal.

Description of Related Art

A memory circuit may be performed reading operations at different frequencies. In a high-frequency reading operation, the memory circuit needs to increase an operating current of a sense amplifier and a charge pump circuit to cope with high-speed reading operations. However, in a low-frequency reading operation, if a high operating current of the sense amplifier and the charge pump circuit is maintained, a waste of current will be generated.

SUMMARY

The present disclosure provides a frequency detection device for a clock signal and a detection method thereof, which can effectively detect a frequency of the clock signal without an additional reference clock signal.

The frequency detection device for the clock signal of the present disclosure includes a pulse signal generator, a sampling signal generator, a delay device, and a sampling circuit. The pulse signal generator detects a plurality of transition edges of the clock signal and generates a pulse signal according to the transition edges of the clock signal. The sampling signal generator generates a sampling signal based on a command signal according to a plurality of pulses of the pulse signal. The delay device delays the command signal to generate a delayed command signal. The sampling circuit samples the delayed command signal according to the sampling signal to generate a detection result.

The frequency detection method of the clock signal of the present disclosure includes: detecting a plurality of transition edges of the clock signal and generating a pulse signal according to the transition edges of the clock signal; generating a sampling signal based on a command signal according to a plurality of pulses of the pulse signal; delaying the command signal to generate a delayed command signal; and sampling the delayed command signal according to the sampling signal to generate a detection result.

Based on the above, the present disclosure uses the delay device to delay the command signal, and uses the sampling signal generator to generate the sampling signal according to the pulse signal generated based on the transition edges of the clock signal, and uses the sampling signal to sample the delayed command signal, and can effectively know whether the frequency of the clock signal is too slow. The frequency detection device of the present disclosure does not need to additionally receive the reference clock signal and can reduce the power consumption caused by the transition edges of the reference clock signal and reducing the required circuit area. In addition, corresponding to the frequency detection result of the clock signal, subsequent circuits (for example, memory circuits) can correspondingly adjust, for example, an operating clock of a charge pump circuit and an operating bias of an address decoder, which can effectively reduce an overall power consumption of the circuit.

DETAILED DESCRIPTION OF DISCLOSED EMBODIMENTS

Figure 1:
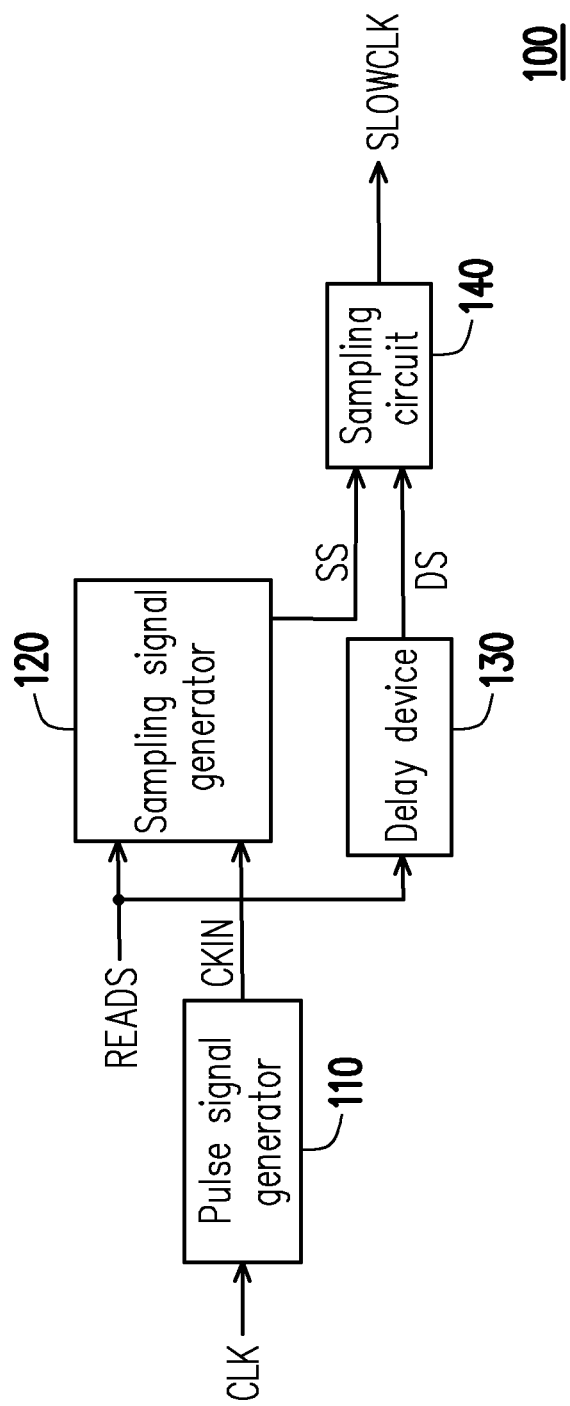
FIG. 1 is a schematic diagram illustrating a frequency detection device for a clock signal according to an embodiment of the present disclosure.

Please refer to FIG. 1. A frequency detection device 100 includes a pulse signal generator 110, a sampling signal generator 120, a delay device 130 and a sampling circuit 140. The pulse signal generator 110 receives a clock signal CLK. The pulse signal generator 110 is used for detecting a plurality of transition edges of the clock signal CLK and generating a pulse signal CKIN according to the transition edges of the clock signal CLK. In this case, the clock signal CLK may be input externally by a user and used as an operating clock for accessing the core circuit (for example, a memory circuit) behind the frequency detection device 100.

In the embodiment, the pulse signal generator 110 can target a plurality of rising edges of the clock signal CLK, or detect a plurality of falling edges of the clock signal CLK. The pulse signal generator 110 corresponds to the rising edge (or the falling edge) of the clock signal CLK to generate a plurality of pulses of the pulse signal CKIN. Specifically, the pulse signal generator 110 may be a one-shot circuit and performs logic operations on the clock signal CLK and an inverse signal of the clock signal CLK to generate the pulse signal CKIN.

In detail, when the pulse signal generator 110 performs an AND logic operation on the clock signal CLK and the inverse signal of the clock signal CLK, the pulse signal generator 110 can correspond to the rising edges of the clock signal CLK to generate the pulses of the pulse signal CKIN. Furthermore, when the pulse signal generator 110 performs a NOR logic operation on the clock signal CLK and the inverse signal of the clock signal CLK, the pulse signal generator 110 can correspond to the falling edges of the clock signal CLK edge to generate the pulses of the pulse signal CKIN.

On the other hand, the sampling signal generator 120 is coupled to the pulse signal generator 110. The sampling signal generator 120 can receive a command signal READS and the pulse signal CKIN generated by the pulse signal generator 110. During a set time interval in performing the frequency detection operation, the command signal READS can be set to a first logic value, and based on the command signal READS, the sampling signal generator 120 generates a sampling signal SS according to a plurality of pulses of the pulse signal CKIN.

Specifically, after the command signal READS is set to the first logic value, the sampling signal generator 120 can correspond to the Mth pulse of the pulse signal CKIN to generate an enabled sampling signal SS. In this case, the abovementioned M can be any positive integer greater than 1 and can be set by designers according to actual needs.

The delay device 130 is coupled to the sampling signal generator 120. The delay device 130 can receive the command signal READS and generate a delayed command signal DS by delaying the command signal READS. The sampling circuit 140 is coupled to the delay device 130 and the sampling signal generator 120. The sampling circuit 140 receives the delayed command signal DS and the sampling signal SS. The sampling circuit 140 uses the sampling signal SS to sample the delayed command signal DS in order to generate a detection result SLOWCLK. In this case, the delay device 130 can delay the command signal READS according to a preset delay time, and delay the transition time point of the delayed command signal DS.

In the embodiment, if the clock signal CLK is too slow, the frequency of the pulse signal CKIN generated according to the transition edges of the clock signal CLK is also too slow. Therefore, a sampling time point of the sampling signal SS generated according to a specific pulse of the pulse signal CKIN may fall behind the transition time point of the delayed command signal DS. In this way, the sampling circuit 140 can generate the detection result SLOWCLK equal to the first logic value, which indicates that the frequency of the clock signal CLK input by the user is too slow.

In the above description, the first logic value may be a logic value of 1, and the second logic value may be a logic value of 0. Alternatively, in other embodiments, the first logic value may be the logic value of 0, and the second logic value may be the logic value of 1.

On the other hand, if the clock signal CLK is not too slow, the sampling time point of the sampling signal SS generated according to a specific pulse of the pulse signal CKIN may fall before the transition time point of the delayed command signal DS. In this way, the sampling circuit 140 can generate the detection result SLOWCLK that is not equal to the first logic value (for example, equal to the second logic value), which indicates that the frequency of the clock signal CLK input by the user is not too slow.

That is, the first detection frequency of the clock signal CLK when the detection result SLOWCLK is equal to the first logic value can be higher than the second detection frequency of the clock signal CLK when the detection result SLOWCLK is equal to the second logic value.

Figure 2:
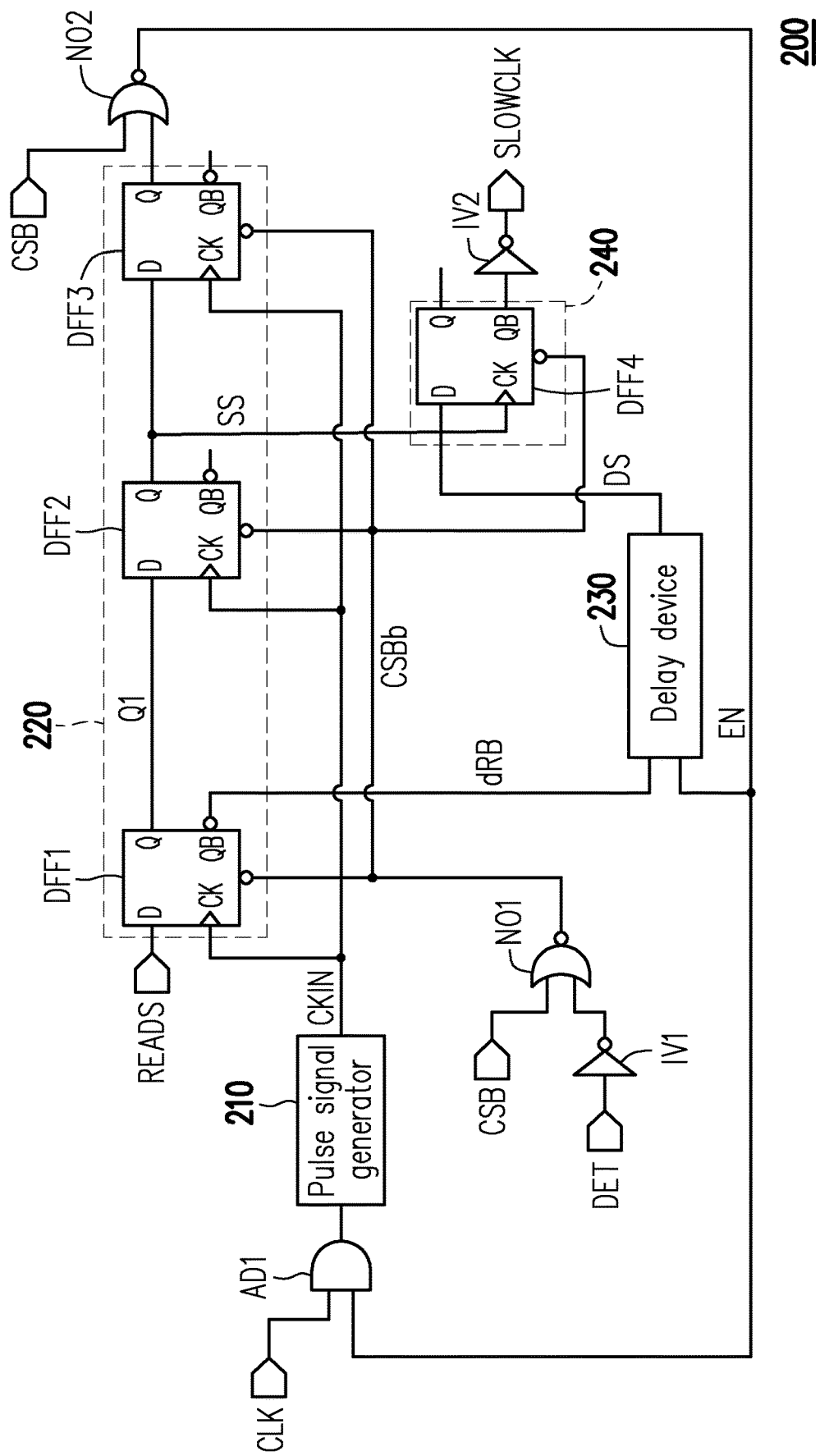
FIG. 2 is a circuit diagram illustrating a frequency detection device for a clock signal according to another embodiment of the present disclosure.

Please refer to FIG. 2. A frequency detection device 200 includes a pulse signal generator 210, a sampling signal generator 220, a delay device 230 and a sampling circuit 240. The pulse signal generator 210 receives a clock signal CLK through an AND gate AD1. In this case, the AND gate AD1 also receives an enabling signal EN, and when the enabling signal EN is a logic value of 0, the AND gate AD1 interrupts so that the pulse signal generator 210 cannot receive the clock signal CLK. At this time, the pulse signal generator 210 does not perform operations. When the enabling signal EN is a logic value of 1, the pulse signal generator 210 can receive the clock signal CLK and generate a pulse signal CKIN according to transition edges of the clock signal CLK.

The sampling signal generator 220 includes a plurality of flip-flops DFF1 to DFF3. Each of the flip-flops DFF1 to DFF3 has a data terminal D, a clock terminal CK, an output terminal Q and an inverted output terminal QB. In this case, the data terminal D of the first level flip-flop DFF1 receives a command signal READS. The clock terminal CK of the flip-flops DFF1 to DFF3 all receives the pulse signal CKIN. The output terminal Q of the flip-flop DFF1 is coupled to the data terminal D of the next stage flip-flop DFF2. The output terminal Q of the flip-flop DFF2 is coupled to the data terminal D of the next stage flip-flop DFF3. The inverted output terminal QB of the flip-flop DFF1 generates a signal dRB. The output terminal Q of the flip-flop DFF2 generates a sampling signal SS. In this case, the signal dRB may be the inverse of the command signal READS with a time delay added. The flip-flop DFF1 can perform a synchronous operation of the command signal READS corresponding to a pulse of the pulse signal CKIN.

In the embodiment, after the command signal READS transitions to a first logic value, the flip-flop DFF2 can enable the sampling signal SS corresponding to a second pulse of the pulse signal CKIN (transitions to the first logic value).

The delay device 230 receives the signal dRB and the enabling signal EN. When the enabling signal EN is the logic value of 0, the delay device 230 is not activated. On the other hand, when the enabling signal EN is the logic value of 1, the delay device 230 is activated. The delay device 230 can delay the signal dRB and generate a delayed command signal DS.

The sampling circuit 240 is constructed by a flip-flop DFF4. A data terminal D of the flip-flop DFF4 receives the delayed command signal DS, and a clock terminal CK of the flip-flop DFF4 receives the sampling signal SS. In this way, the flip-flop DFF4 can use the sampling signal SS to sample the delayed command signal DS in order to generate a detection result SLOWCLK.

Incidentally, in the embodiment, the flip-flop DFF4 can use an inverted output terminal QB and an inverter IV2 to generate the detection result SLOWCLK. In other embodiments, the flip-flop DFF4 can also use the inverted output terminal QB to directly generate the detection result SLOWCLK.

It can be seen that the frequency detection device 200 of the present disclosure can quickly generate the detection result SLOWCLK by using the sampling circuit 240 to sample the delayed command signal DS for the sampling signal SS, which corresponding to a frequency change of the clock signal CLK provided by a user, a rapid response can be achieved.

Furthermore, the frequency detection device 200 further includes an NOR gate NO1 and an inverter IV1. The inverter IV1 receives a signal DET, and the NOR gate NO1 receives an output signal of the inverter IV1 and a chip selection signal CSB. In this case, when one of the chip selection signal CSB and the output signal of the inverter IV1 is the logic value of 1, the NOR gate NO1 can generate an output signal CSBb to reset the sampling signal generator 220 and the sampling circuit 240. In this case, when the output signal of the inverter IV1 is the logic value of 0, the output signal CSBb can be an inverse chip selection signal.

The frequency detection device 200 further includes an NOR gate NO2. The NOR gate NO2 receives an output signal of the output terminal Q of the flip-flop DFF3 and the chip selection signal CSB and generates the enabling signal EN.

Figure 3A:
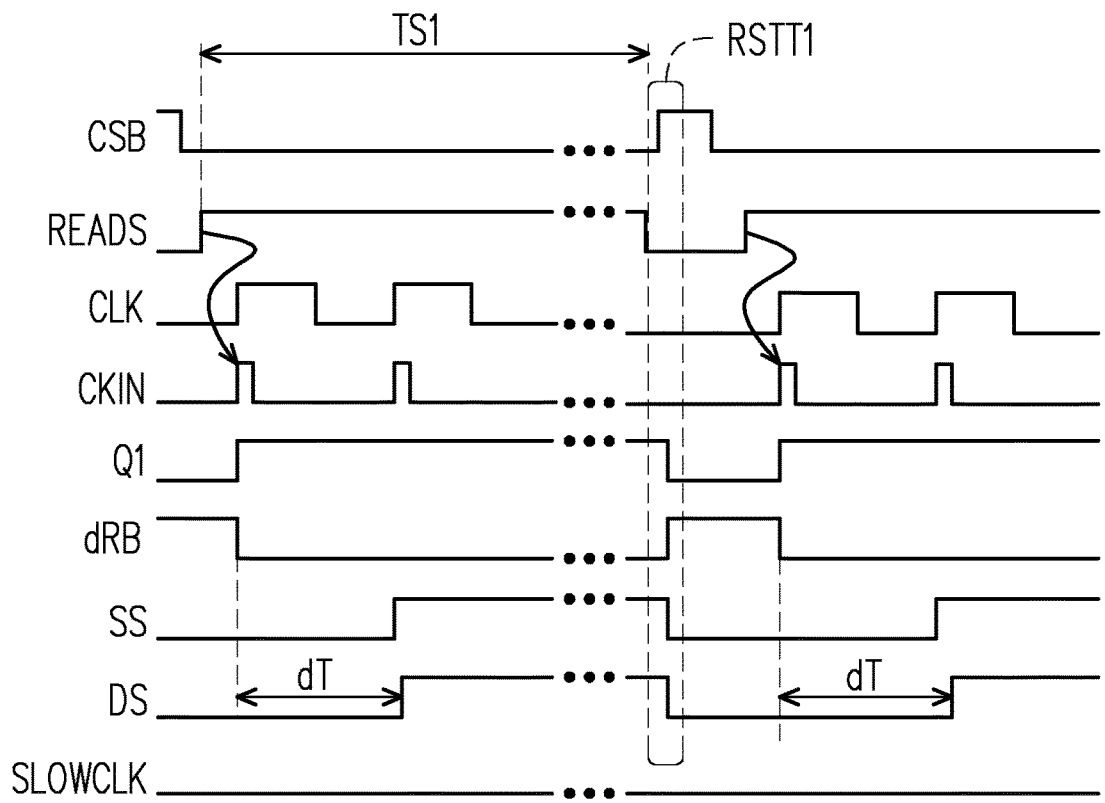
FIG. 3A and FIG. 3B are waveform diagrams illustrating a frequency detection operation of a frequency detection device according to an embodiment of the present disclosure.
Figure 3B:
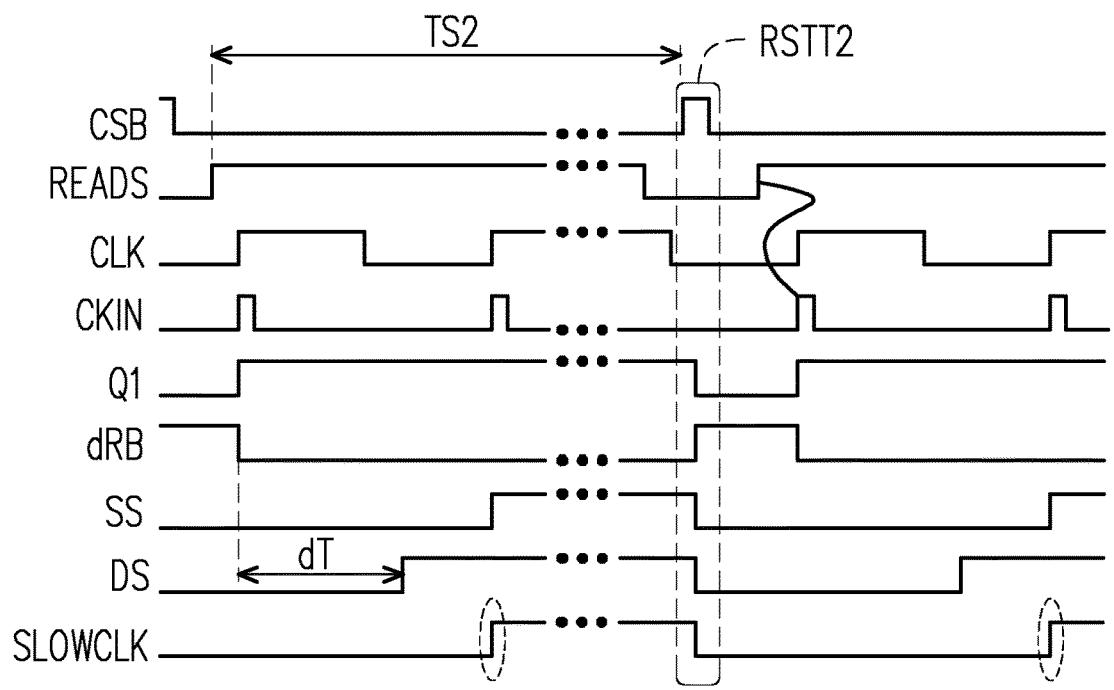

Please refer to FIG. 2, FIG. 3A, and FIG. 3B simultaneously. FIG. 3A is a waveform diagram of a frequency detection operation when the clock signal CLK is not too slow. In this case, when the command signal READS is set to the first logic value (for example, the logic value of 1) in a set time interval TS1, the pulse signal generator 210 generates the pulse signal CKIN with a plurality of pulses according to a rising edge of the clock signal CLK. A first pulse of the pulse signal CKIN can cause the output terminal Q of the flip-flop DFF1 to generate a signal Q1 of the logic value of 1, and the flip-flop DFF2 can generate the sampling signal SS at the output terminal Q according to the second pulse of the pulse signal CKIN. On the other hand, the delay device 230 generates the delayed command signal DS according to delay the signal dRB provided by an inverted output terminal QB of the flip-flop DFF1, in which a delay time dT is between the delayed command signal DS and a rising edge of the signal Q1.

In addition, the sampling circuit 240 samples the delayed command signal DS according to the sampling signal SS. In FIG. 3A, the sampling circuit 240 samples the delayed command signal DS according to the sampling signal SS to generate the detection result SLOWCLK equal to the logic value of 0, which indicates that the frequency of the clock signal CLK is not too slow.

Incidentally, during a reset time period RSTT1, the chip selection signal CSB can be pulled high to reset the sampling signal generator 220 and the sampling circuit 240. After the chip selection signal CSB is pulled low again, the frequency detection device 200 can perform the next frequency detection operation.

Please note here that the delay time dT can be set according to an allowable value of whether a frequency of the clock signal CLK to be determined is too high. In this case, if the allowable frequency of the clock signal CLK is too slow and the allowable value is high, the delay device 230 can provide a relatively large delay time dT. On the other hand, if the allowable frequency of the clock signal CLK is too slow and the allowable value is low, the delay device 230 can provide a relatively small delay time dT.

FIG. 3B is a waveform diagram of a frequency detection operation when the clock signal CLK is too slow. In this case, when the command signal READS is set to the first logic value (for example, the logic value of 1) in a set time interval TS2, the pulse signal generator 210 generates the pulse signal CKIN with a plurality of pulses according to the rising edge of the clock signal CLK. The first pulse of the pulse signal CKIN can cause the output terminal Q of the flip-flop DFF1 to generate the signal Q1 of the logic value of 1, and the flip-flop DFF2 can generate the sampling signal SS at the output terminal Q according to the second pulse of the pulse signal CKIN. On the other hand, the delay device 230 generates the delayed command signal DS according to the signal dRB provided by the inverted output terminal QB of the delay flip-flop DFF1, in which the delay time dT is between the delayed command signal DS and the rising edge of the signal Q1.

In addition, the sampling circuit 240 samples the delayed command signal DS according to the sampling signal SS. In FIG. 3B, the sampling circuit 240 samples the delayed command signal DS according to the sampling signal SS to generate the detection result SLOWCLK equal to the logic value of 1, which indicates that the frequency of the clock signal CLK is too slow.

Likewise, during a reset time period RSTT2, the chip selection signal CSB can be pulled high to reset the sampling signal generator 220 and the sampling circuit 240. After the chip selection signal CSB is pulled low again, the frequency detection device 200 can perform the next frequency detection operation.

Figure 4:
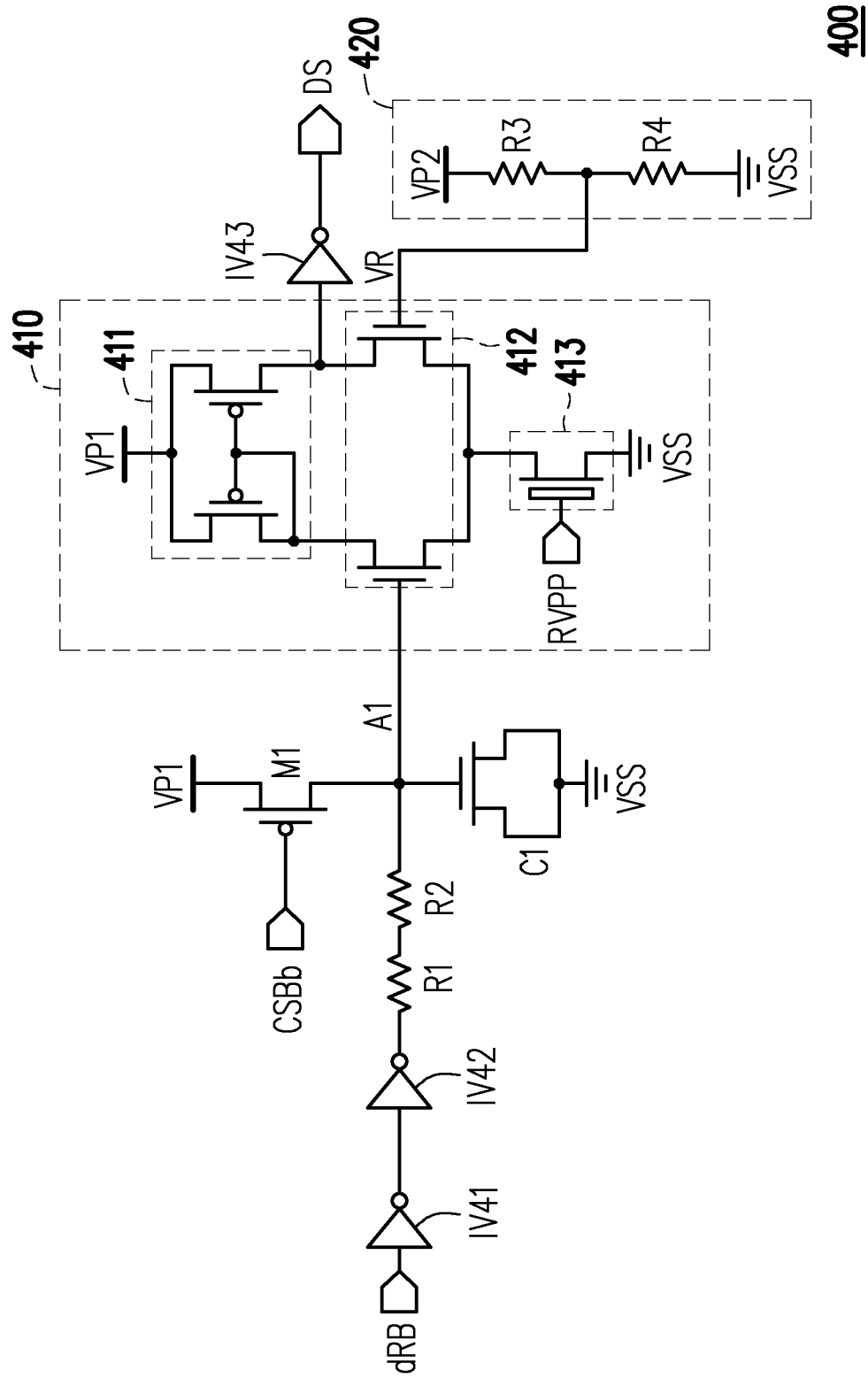
FIG. 4 is a schematic diagram illustrating an embodiment of a delay device of a frequency detection device according to an embodiment of the present disclosure.

Please refer to FIG. 4. A delay device 400 includes a comparison circuit 410 and a reference voltage generator 420. The comparison circuit 410 includes a differential pair 412, an active load 411, and a current source 413. A first terminal of the differential pair 412 receives a signal A1, and a second terminal receives a reference voltage VR. An input stage of the delay device 400 may include series-connected inverters IV41 and IV42, and resistors R1 and R2. The signal A1 can be generated by a delayed signal dRB, wherein the signal A1 can be an inverse delay signal of a command signal. A first end of the differential pair 412 is coupled to a transistor M1 and a capacitor C1. The transistor M1 is connected in series between the first end of the differential pair 412 and a power supply voltage VP1, and the capacitor C1 is connected in series between the first end of the differential pair 412 and a power supply voltage VSS. The power supply voltage VP1 may be an operating power supply, and the power supply VSS may be a reference ground power supply.

A control terminal of the transistor M1 receives an output signal CSBb as an inverse chip selection signal, and when the output signal CSBb is equal to the logic value of 0, the delay device 400 does not perform operations.

Furthermore, the reference voltage generator 420 includes resistors R3 and R4. The resistors R3 and R4 are connected in series between a power supply voltage VP2 and the power supply voltage VSS to form a voltage divider circuit. The reference voltage generator 420 divides the power supply voltage VP2 to generate the reference voltage VR, in which the power supply voltage VP2 may or may not be equal to the power supply voltage VP1, and the reference voltage VR may be equal to half of the power supply voltage VP2.

In the embodiment, the delay device 400 generates a delayed effect by comparing the inverse delay signal of the command signal with the reference voltage VR, instead of using a plurality of inverters to provide the delayed effect. By this means, the delay device 400 does not generate power consumption due to frequent transition operations of the inverters, thereby achieving the purpose of energy saving and carbon reduction.

Incidentally, the current source 413 of the comparison circuit 410 is biased to the power supply voltage RVPP and can provide a stable biased current.

Figure 5:
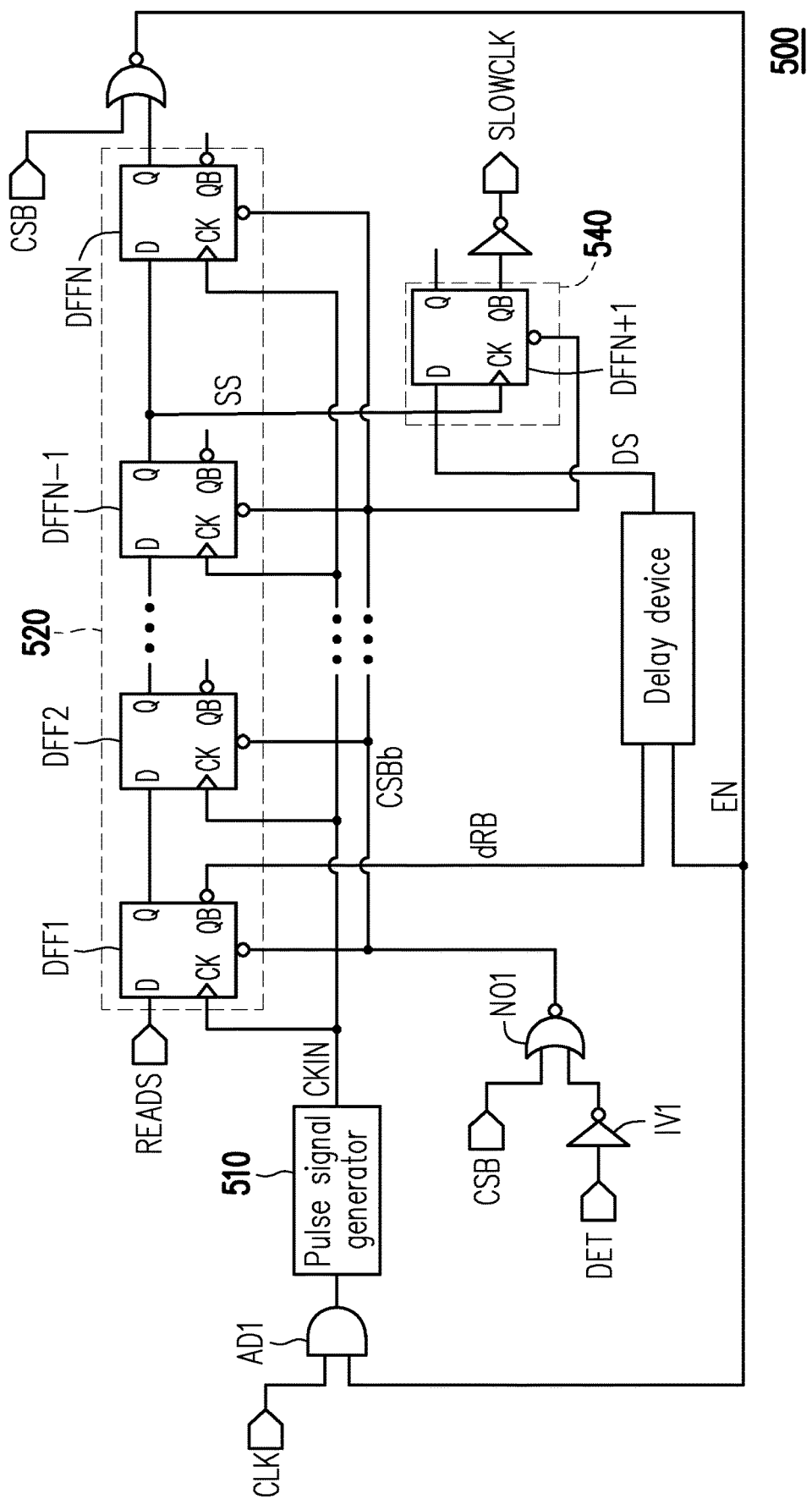
FIG. 5 is a circuit diagram illustrating a frequency detection device for a clock signal according to another embodiment of the present disclosure.

Please refer to FIG. 5. A frequency detection device 500 includes a pulse signal generator 510, a sampling signal generator 520, a delay device 530, and a sampling circuit 540. The frequency detection device 500 of the embodiment is substantially the same as the aforementioned frequency detection device 200, so details of related operations are omitted here. Different from the frequency detection device 200, in the frequency detection device 500, the sampling signal generator 520 may include a plurality of flip-flops DFF1 to DFFN (for example, N numbered, where N is a positive integer). In this case, designers can select any one of the flip-flops DFF2 to DFFN−1 to generate a sampling signal SS according to actual application requirements with no specific limitations.

Furthermore, in the embodiment, the sampling circuit 540 can be constructed by using a flip-flop DFFN+1.

Incidentally, in the embodiment, the frequency detection device 500 can be applied to a memory circuit and performs a frequency detection operation of a clock signal CLK input by a user when the reading operation is performed. Therefore, a command signal READS according to the frequency detection device 500 can read commands for data executed for the memory circuit. Without doubt, the frequency detection device 500 can also be combined with other types of command signals to perform the frequency detection operation with no set limitations.

In the embodiment, when a frequency of a clock signal is detected to be too slow, subsequent circuits (for example, memory circuits) can correspondingly adjust, for example, an operating clock of a charge pump circuit and an operating bias of an address decoder. In this way, power consumption of the whole circuit can be effectively reduced and working efficiencies of the whole circuit can be effectively improved.

Figure 6:
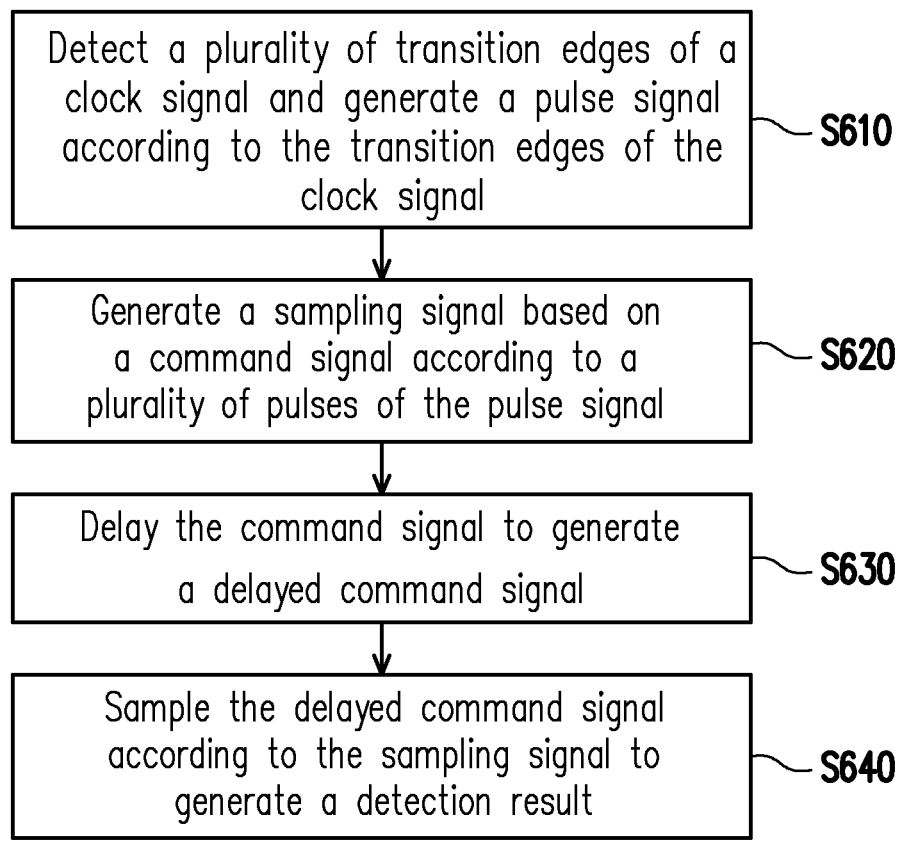
FIG. 6 is a flowchart illustrating a frequency detection operation of a clock signal according to an embodiment of the present disclosure.

Please refer to FIG. 6. In step S610, a plurality of transition edges of a clock signal are detected, and a pulse signal is generated according to the transition edge of the clock signal. In step S620, a sampling signal is generated based on a command signal according to a plurality of pulses of the pulse signal. In addition, in step S630, the command signal is delayed to generate a delayed command signal. In step S640, the delayed command signal is sampled according to the sampling signal to generate a detection result.

The implementation details of the abovementioned steps have been described in detail in the foregoing embodiments and the implementation manner thereof and so are omitted here.

To sum up, the frequency detection device for the clock signal of the present disclosure generates the pulse signal according to the transition edges of the clock signal and generates the sampling signal according to the pulse signal. The sampling signal is used for sampling the delayed command signal and by this means knows whether the frequency of the clock signal is too slow. The frequency detection device of the present disclosure does not need a reference clock signal, which can effectively reduce the required power consumption and the circuit area. In addition, the present disclosure uses the sampling circuit to sample the delayed command signal according to the sampling signal, so that the frequency state of the clock signal can be quickly obtained to improve the response rate.

What is claimed is:

1. A frequency detection device for a clock signal, comprising:
   a pulse signal generator for detecting a plurality of transition edges of the clock signal and generating a pulse signal according to the transition edges of the clock signal;
   a sampling signal generator for generating a sampling signal based on a command signal according to a plurality of pulses of the pulse signal;
   a delay device for delaying the command signal to generate a delayed command signal; and
   a sampling circuit for sampling the delayed command signal according to the sampling signal to generate a detection result.

2. The frequency detection device according to claim 1, wherein the pulse signal generator is a one shot circuit, which generates the pulses of the pulse signal according to a plurality of rising edges of the clock signal.

3. The frequency detection device according to claim 1, wherein the sampling signal generator comprises a plurality of flip-flops, a plurality of clock terminals of the flip-flops receive the pulse signal, an output terminal of each of the flip-flops is coupled to a data terminal of each of the flip-flops of a next stage, the data terminal of the flip-flop of a first stage receives the command signal, and the output terminal of the flip-flop of a last stage generates an enabling signal.

4. The frequency detection device according to claim 3, wherein an output terminal of one of the flip-flops of a second stage to the last stage generates the sampling signal.

5. The frequency detection device according to claim 3, wherein the pulse signal generator and the delay device are activated according to the enabling signal.

6. The frequency detection device according to claim 3, wherein the output terminal of the flip-flop of the first stage transmits an inverse delay signal of the command signal.

7. The frequency detection device according to claim 6, wherein the delay device comprises:
   a comparison circuit for generating the delayed command signal according to comparing the inverse delay signal of the command signal and a reference voltage; and
   a reference voltage generator for generating the reference voltage.

8. The frequency detection device according to claim 7, wherein the delay device further comprises:
   a transistor, coupled between a first power supply voltage and a terminal of the comparison circuit receiving the inverse delay signal of the command signal, and controlled by an inverse chip selection signal; and
   a capacitor, coupled between the terminal of the comparison circuit receiving the inverse delay signal of the command signal and a second power supply voltage.

9. The frequency detection device according to claim 7, wherein the comparison circuit comprises:
   a differential pair for respectively receiving the inverse delay signal of the command signal and the reference voltage;
   an active load, coupled between the differential pair and a first power supply voltage; and
   a current source, coupled between the differential pair and a second power supply voltage.

10. The frequency detection device according to claim 7, wherein the reference voltage generator comprises:
    a voltage divider circuit for receiving a third power supply voltage and dividing the third power supply voltage to generate the reference voltage.

11. The frequency detection device according to claim 1, wherein the sampling circuit comprises:
    a flip-flop, having a data terminal for receiving the delayed command signal, a clock terminal for receiving the sampling signal, and an output terminal for generating the detection result.

12. The frequency detection device according to claim 1, wherein the sampling signal generator and the sampling circuit perform a reset operation according to a chip selection signal.

13. The frequency detection device according to claim 12, wherein when the sampling signal generator and the sampling circuit perform a reset operation, the pulse signal generator and the delay device stop operating.

14. A frequency detection method of a clock signal, comprising:
    detecting a plurality of transition edges of the clock signal and generating a pulse signal according to the transition edges of the clock signal;
    generating a sampling signal based on a command signal according to a plurality of pulses of the pulse signal;
    delaying the command signal to generate a delayed command signal; and
    sampling the delayed command signal according to the sampling signal to generate a detection result.

15. The frequency detection method according to claim 14, wherein the step of generating the pulse signal according to the transition edges of the clock signal comprises:
    generating the pulses of the pulse signal according to a plurality of rising edges of the clock signal.

16. The frequency detection method according to claim 14, wherein the step of generating the sampling signal according to a plurality of the pulses of the pulse signal comprises:
    sequentially delaying the command signal according to the pulses of the pulse signal to generate the sampling signal.

17. The frequency detection method according to claim 14, further comprising:
    in a detection operation, setting the command signal to a first logic value in a set time interval;
    when the generated detection result is equal to the first logic value, the detection result indicating that a frequency of the clock signal is a first detection frequency; and
    when the generated detection result is equal to a second logic value, the detection result indicating that a frequency of the clock signal is a second detection frequency,
    wherein the first detection frequency is higher than the second detection frequency, and the first logic value is an inverse of the second logic value.

\* \* \* \* \*